(12) United States Patent
Li et al.

(10) Patent No.: US 12,047,037 B2
(45) Date of Patent: Jul. 23, 2024

(54) OSCILLATOR WITH TEMPERATURE COMPENSATION AND ELECTRONIC DEVICE USING THE SAME

(71) Applicant: NUVOTON TECHNOLOGY CORPORATION, Hsinchu (TW)

(72) Inventors: Cheng-Tao Li, Zhubei (TW); Ping-Wen Lai, Zhubei (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 49 days.

(21) Appl. No.: 17/981,204

(22) Filed: Nov. 4, 2022

(65) Prior Publication Data

US 2023/0344384 A1 Oct. 26, 2023

(30) Foreign Application Priority Data

Apr. 20, 2022 (TW) .................................. 111115020

(51) Int. Cl.
*H03B 5/04* (2006.01)
*H03B 5/24* (2006.01)

(52) U.S. Cl.
CPC ................. *H03B 5/04* (2013.01); *H03B 5/24* (2013.01)

(58) Field of Classification Search
CPC ....................................................... H03B 5/04

USPC ........................................................... 331/66
See application file for complete search history.

(56) References Cited

U.S. PATENT DOCUMENTS

| 8,242,852 | B2* | 8/2012 | Denier ................ H03K 3/0231 331/111 |
| 2018/0062626 | A1* | 3/2018 | Hunter .................... H03K 4/501 |
| 2024/0048130 | A1* | 2/2024 | Li ........................... H03K 3/011 |

* cited by examiner

*Primary Examiner* — Joseph Chang
(74) *Attorney, Agent, or Firm* — MUNCY, GEISSLER, OLDS & LOWE, P.C.

(57) ABSTRACT

An oscillator equipped with a temperature compensation circuit is illustrated. Through the temperature compensation circuit, a transistor of a current mirror circuit of the oscillator which outputs a reference current to a voltage matching circuit is controlled by the temperature compensation voltage. Both of the temperature compensation voltage and a reference current decrease as the temperature rises, and a delay time of the oscillation voltage is proportional to the temperature compensation voltage and inversely proportional to the reference current. Therefore, the effects of temperature on the delay time just cancel each other out. The delay time of the oscillating voltage is related to the frequency of the clock signal. Therefore, if the delay time of the oscillating voltage is not affected by temperature, the frequency of the clock signal will not be affected by temperature.

18 Claims, 3 Drawing Sheets

OSCILLATOR WITH TEMPERATURE COMPENSATION AND ELECTRONIC DEVICE USING THE SAME

BACKGROUND OF THE DISCLOSURE

1. Field of the Disclosure

The present disclosure relates to an oscillator and an electronic device using the same and particularly to an oscillator with temperature compensation and an electronic device using the same, so as to eliminate the influence of temperature on frequency, thereby implementing low frequency drift and low power requirement.

2. Description of the Related Art

Please refer to FIG. 1, which is a circuit diagram showing an oscillator of prior art. The oscillator 1 comprises two reference current sources 10, 12, a clock buffer 14, NMOS transistors M1, M2, M3, a resistor R and a capacitor C. In FIG. 1, a current mirror circuit is composed by two reference current sources 10, 12, and NMOS transistors M1, M2, wherein the current mirror circuit has a bias end, a reference current output end and an oscillation voltage output end, wherein the bias end is electrically connected to the resistor R for generating a reference voltage Vref. The reference current output end outputs a reference current Iref to the capacitor C, and the oscillation voltage end output an oscillation voltage to the clock buffer 14. A gate of NMOS transistor M3 receives a clock signal which is buffered by the clock buffer 1. Hence, the gate of NMOS transistor M3 is controlled by the buffered clock signal, to decide to discharge or charge the capacitor C, so that a drain of NMOS transistor M2 acts as the oscillation voltage output end which outputs oscillation voltage.

The reference current Iref changes with the temperature change, so that the oscillator 1 of FIG. 1 has a great change in the frequency of the clock signal when the temperature changes. In order to decrease a range of the frequency drift, an extra control circuit is required to compensate the frequency drift. Nowadays applications are required low power and low frequency drift (that is. the drifted frequency is controlled within a specific frequency range), but the extra control circuit causes extra power consumption. Therefore, low power and low frequency drift are trade-off factor in the circuit design of the oscillator 1, and an improved oscillator is needed.

SUMMARY OF THE DISCLOSURE

An embodiment of the present disclosure provides an oscillator with temperature compensation. The oscillator comprises a current mirror circuit, a bias circuit, a temperature compensation circuit, a charge storage circuit and a voltage matching circuit. The current mirror circuit has a bias end, a first reference current output end, a second reference current output end, a third reference output end and an oscillation voltage output end, wherein the current mirror circuit respectively outputs a first reference current, a second reference current and a third reference current through the first reference current output end, the second reference output end and the third reference current output end, and the current mirror circuit outputs an oscillation voltage through the oscillation voltage output end, wherein the first reference current, the second reference current, and the third reference current decrease when a temperature increases. The bias circuit is electrically connected to a bias end, and used to generate reference voltage as a bias voltage of the current mirror circuit. The temperature compensation circuit, electrically connected to the first reference current output end, is configured to provide a first voltage to the current mirror circuit, so as to make the current mirror circuit generate a temperature compensation voltage, wherein the temperature compensation voltage is configured to control whether the current mirror circuit outputs the third reference current to the third reference current output end, and the temperature compensation voltage decreases as when the temperature increases. The charge storage circuit, electrically connected to the second reference current output end, is configured to receive the second reference current for charging. The voltage matching circuit, electrically connected to the third reference current output end, is configured to provide a second voltage to the current mirror circuit, wherein the second voltage is the same as the first voltage and the reference voltage.

An embodiment of the present disclosure also provides an electronic device, and the electrical device comprises the oscillator with temperature compensation and a function circuit. The function circuit is electrically connected to the oscillator, and configured to manipulate according to the oscillation voltage of the oscillator.

According to above-mentioned contents, the oscillator provided by the embodiment of the present disclosure can make the clock signal generated by the oscillation voltage of the oscillator have low frequency drift (that is, frequency hardly changes with the temperature change) by using the temperature compensation, and the oscillator does not need the extra control circuit for compensating, but still has the effect of low power consumption.

In order to further understand the technology, means and effects of the present disclosure, reference may be made to the following detailed description and drawings, so that the objects, features and concepts of the present disclosure can be fully and specifically understood. However, the following detailed description and drawings are only used to refer and illustrate the implementation of the present disclosure, and are not intended to limit the present disclosure.

BRIEF DESCRIPTION OF THE DRAWINGS

The drawings are provided to enable person having ordinary skill in the art can further understand the present disclosure, and the drawings are incorporated in and constitute a part of the specification of the present disclosure. The drawings illustrate exemplary embodiments of the present disclosure, and the description in the specification of the present disclosure is used to explain the principal of the present disclosure.

DESCRIPTION OF THE PREFERRED EMBODIMENTS

Figure 1:
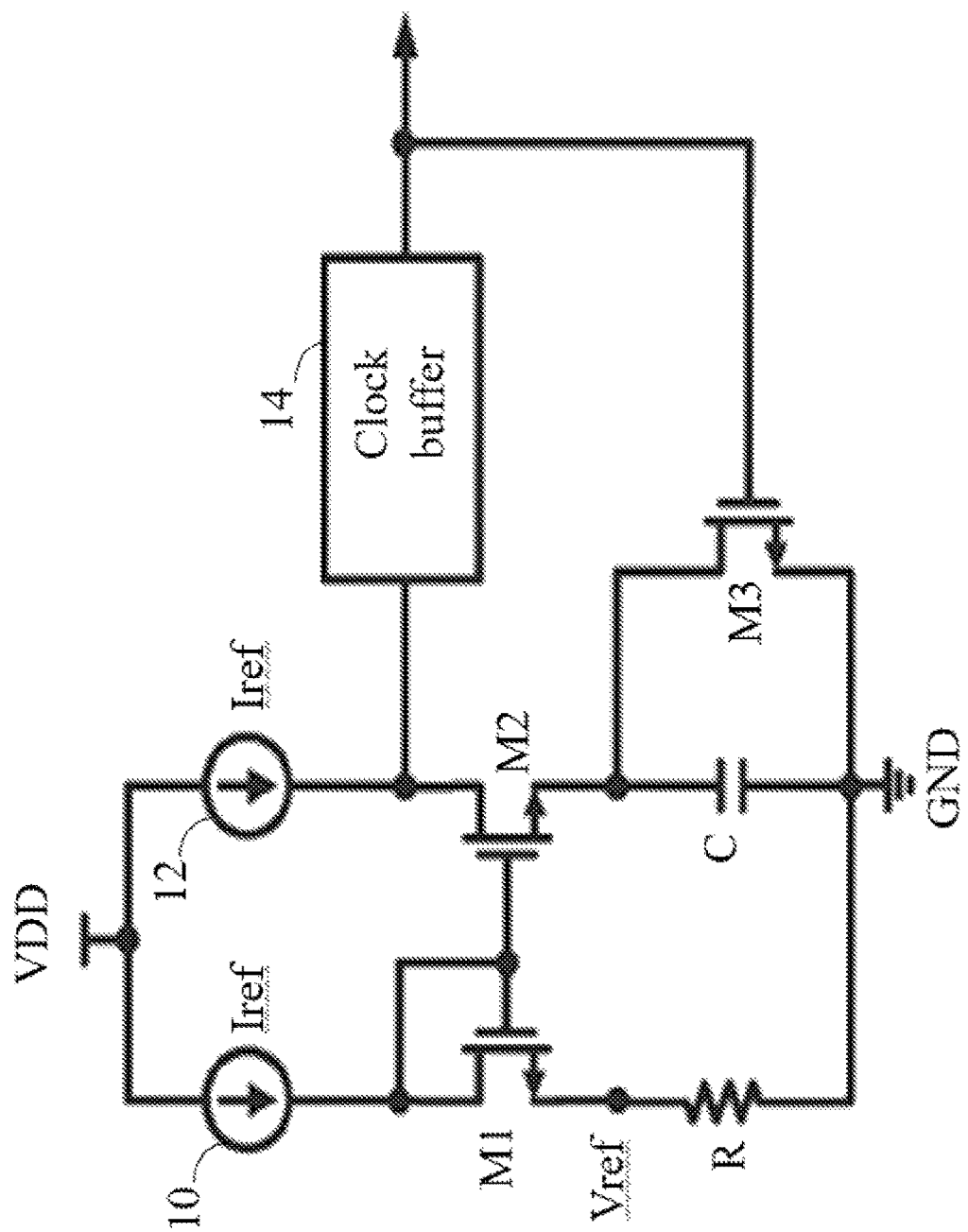
FIG. 1 is a circuit diagram of an oscillator in prior art.

The following embodiments of the present disclosure are herein described in detail with reference to the accompanying drawings. These drawings show specific examples of the embodiments of the present disclosure. These embodiments are provided so that this disclosure will be thorough and complete, and will fully convey the scope of the disclosure to those skilled in the art. It is to be acknowledged that these embodiments are exemplary implementations and are not to be construed as limiting the scope of the present disclosure in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include", and variations such as "comprises", "comprising", "includes", or "including", will be acknowledged to imply the inclusion of stated elements but not the exclusion of any other elements.

In order to solve the above-mentioned conventional problems, an embodiment of the present disclosure is to provide an oscillator with temperature compensation and electronic device using the same. Through a temperature compensation circuit, a frequency of a signal clock, generated by an oscillation voltage of the oscillator of the embodiment of the present disclosure, has low frequency drift (that is, frequency hardly changes with the temperature change), and the oscillator does not need to have extra controlled circuit for compensation. Therefore, the oscillator according to the embodiment of the present disclosure achieves requirements of low frequency drift and low power consumption.

Furthermore, the oscillator is equipped with the temperature compensation circuit, thereby making a transistor of a current mirror circuit of the oscillator which outputs a reference current to a voltage matching circuit be controlled by the temperature compensation voltage. Both of the temperature compensation voltage and a reference current decrease as the temperature rises, and a delay time of the oscillation voltage is proportional to the temperature compensation voltage and inversely proportional to the reference current. Therefore, the effects of temperature on the delay time just cancel each other out. Furthermore, the delay time of the oscillating voltage relates to the frequency of the clock signal. Therefore, if the delay time of the oscillating voltage is not affected by temperature, the frequency of the clock signal will not be affected by temperature. Accordingly, the oscillator of the embodiment of the present disclosure has an advantage of low frequency drift. Additionally, since the oscillator doesn't set extra controlled circuit to compensate, but only through the temperature compensation circuit implemented by a single transistor. As a result, the number of additional circuit components is little. Therefore, the oscillator of the embodiment of the present disclosure also has an advantage of low power consumption.

Figure 2:
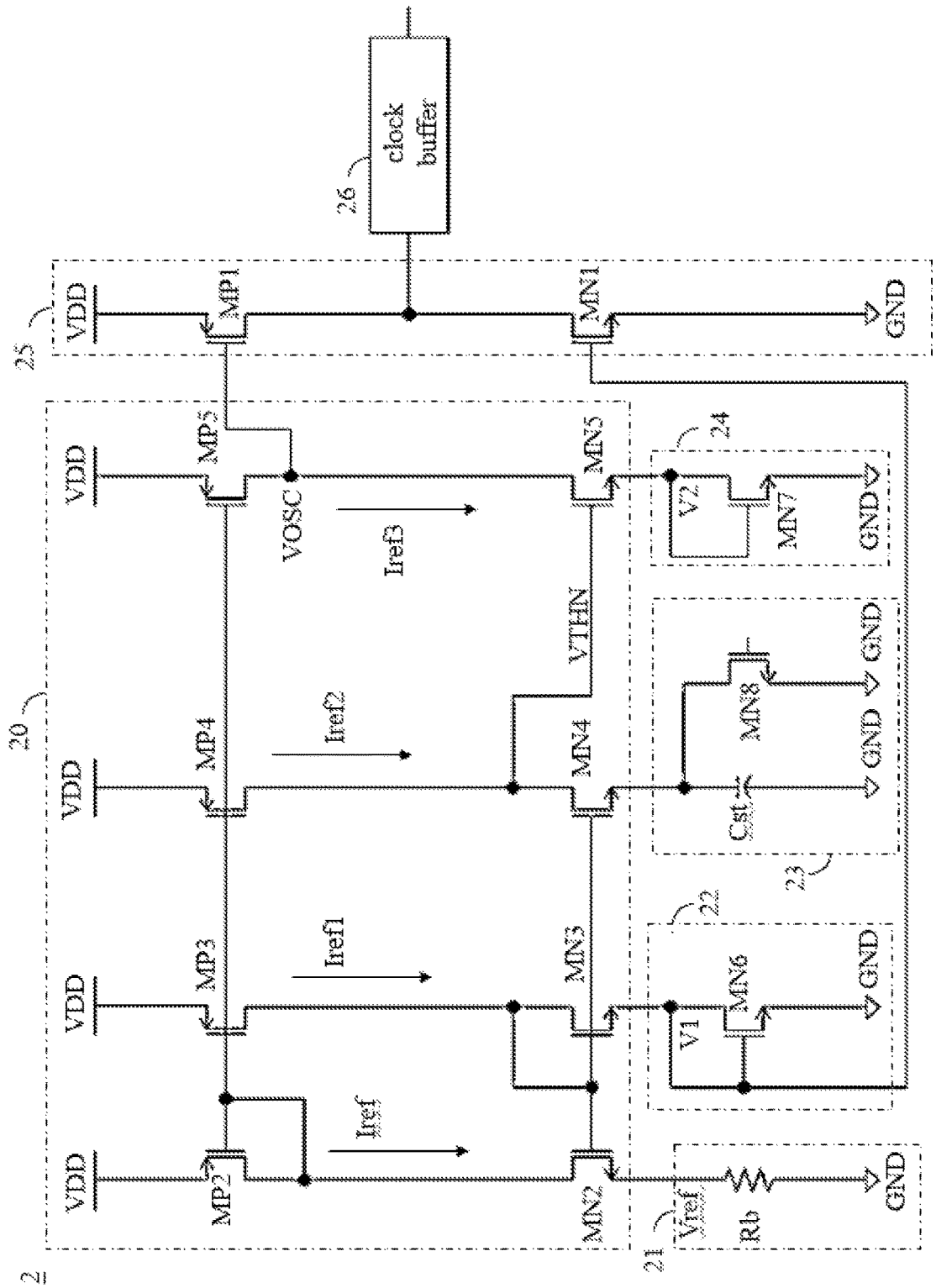
FIG. 2 is a circuit diagram of an oscillator of an embodiment, according to the present disclosure.

Please refer to FIG. 2, which is a circuit diagram of an oscillator of an embodiment, according to the present disclosure. The oscillator comprises a current mirror circuit 20, a bias circuit 21, a temperature compensation circuit 22, a charge storage circuit 23, a voltage matching circuit 24, an output stage circuit 25 and a clock buffer 26. The current mirror circuit 20 is electrically connected to the bias circuit 21, the compensation circuit 22, the charge storage circuit 23, the voltage matching circuit 24 and the output stage circuit 25, and configured to output an oscillation voltage to the output stage circuit 25. The output stage circuit 25 is electrically connected to the current mirror circuit 20, and the output stage circuit is configured to generate a clock signal to the clock buffer 26, so as to make the clock buffer 26 buffer the clock signal and output the buffered clock signal. Please note that the oscillator may not need the output stage circuit 25 and the clock buffer 26 in another application. The oscillator 2 may not need clock buffer 26 in another application.

The current mirror circuit 20 has a bias end, a first reference current output end, a second reference current output end, a third reference output end, and an oscillation voltage output end. The current mirror circuit 20 outputs a first reference current Iref1, a second reference current Iref2 and a third reference current Iref3 through the first reference current end, the second reference current end and the third reference current end, wherein the first reference current Iref1, the second reference current Iref2 and the third reference current Iref3 relate to a reference current Iref and are usually as multiples of the reference current Iref. According to the practical applications, the reference current Iref, the first reference current Iref1, the second reference current Iref2 and the third reference current Iref3 may all be the same, partially the same or all different from each other. The current mirror 20 outputs an oscillation voltage VOSC through the oscillation voltage output end. The reference current Iref, the first reference current Iref1, the second reference current Iref2 and the third reference current Iref3 decrease when a temperature increases, and that is, these currents have negative temperature coefficients.

Furthermore, the current mirror circuit 20 comprises PMOS transistors MP2~MP5 and NMOS transistors MN2~MN5. Every source of PMOS transistors MP2~MP5 is electrically connected to a supply voltage VDD. A gate of PMOS transistor MP2 is electrically connected to a drain of PMOS transistor MP2 and every gate of PMOS transistors MP3~MP5. Drain of NMOS transistors MN2~MN5 are respectively electrically connected to drain of PMOS transistor MP2~MP5. A gate of NMOS transistor MN3 is electrically connected to a gate of NMOS transistor MN2, a gate of NMOS transistor MN4 and a drain of NMOS transistor MN3. A source of NMOS transistor MN2 acts as the bias end of the current mirror circuit 20. A source of NMOS transistor MN3 acts as the first reference current output end of the current mirror circuit 20. A drain of PMOS transistor MP5 acts as the oscillation voltage output end of the current mirror circuit 20. A drain of NMOS transistor MN4 is electrically connected to a gate of NMOS transistor MN5. A source of NMOS transistor MN4 acts as the second reference current output end of the current mirror circuit 20. A source of NMOS transistor MN5 acts as the third reference current output end of the current mirror circuit 20.

The bias circuit 21 is electrically connected to the bias end of the current mirror circuit 20, and the bias circuit 21 is configured to generate a reference voltage Vref as a bias voltage of the current mirror circuit 20. The bias circuit comprises a bias resistor Rb, wherein one end of the bias resistor Rb and another one end of the bias resistor are respectively electrically connected to the bias end of the current mirror circuit 20 (that is, the source of NMOS transistor MN2) and the ground voltage GND (or low voltage). Please note that the bias circuit 21 is only implemented with the bias resistor Rb in the embodiment of FIG. 2, but the disclosure is not limited thereto.

The temperature compensation circuit 22 is electrically connected to the first reference current output end of the current mirror circuit 20. The temperature compensation circuit 22 is configured to provide a first voltage V1 to the current mirror circuit 20, to make the current mirror circuit 20 generate a temperature compensation voltage VTHN on the gate of NMOS transistor MN5. The compensation voltage VTHN is configured to control whether the current mirror circuit 20 outputs the third reference current Iref3 to the third reference current output end of the current mirror circuit 20 (by using the temperature compensation voltage VTHN to control the NMOS transistor MN5 to be turned on or off).

In this embodiment, the temperature compensation circuit 22 comprises a NMOS transistor MN6. A drain of the NMOS transistor MN6 is electrically connected to the first reference current output end of the current mirror circuit 20 and a gate of NMOS transistor MN6, and a source of the NMOS transistor MN6 is electrically connected to the ground voltage GND. The temperature compensation circuit 22 provides the first voltage V1 on the first reference current output end of the current mirror circuit 20 as a gate-source voltage of the NMOS transistor MN6. Please note that the temperature compensation circuit 22 is only implemented by the NMOS transistor MN6 in this embodiment, but the disclosure is not limited thereto.

The charge storage circuit 23 electrically connected to the second reference current output end of the current mirror circuit 20 is configured to receive the second reference current Iref2 for charging. In this embodiment, the charge storage circuit 23 comprises a NMOS transistor MN8 and a capacitor Cst. The two ends of the capacitor Cst are respectively electrically connected to the second reference current output end of the current mirror circuit 20 and the ground voltage GND. A gate of the NMOS transistor MN8 is electrically connected to a discharge reset signal. A drain of the NMOS transistor MN8 is electrically connected to the second reference current output end of the current mirror circuit 20, and a source of the NMOS transistor MN8 is electrically connected to the ground voltage GND. By the way, the NMOS transistor MN8 may not need to have the charge storage circuit 23 in some application.

The voltage matching circuit 24 is electrically connected to the third reference current output end of the current mirror circuit 20, and configured to provide a second voltage V2 on the third reference current output end of the current mirror circuit 20. The voltage matching circuit 24 is configured to generate a second voltage V2 which match to the first voltage V1, and make the temperature compensation voltage VTHN act as a voltage with the negative temperature coefficient. As a result, the second voltage V2 is the same as the first voltage V1 and the reference voltage Vref. In this embodiment, the voltage matching circuit 24 comprises a NMOS transistor MN7. A drain of the NMOS transistor MN7 is electrically connected to the third reference current output end of the current mirror circuit 20 and a gate of the NMOS transistor MN7, and a source of NMOS transistor MN7 is electrically connected to the ground voltage GND, wherein the second V2 is as a gate-source voltage of NMOS transistor MN7. In other words, the NMOS transistor MN7 also can be replaced by a diode, but a cross voltage of the diode (that is, the second voltage V2) is still the same as the first voltage V1 and the reference voltage Vref.

The output stage circuit 25 is electrically connected to the first reference current output end of the current mirror circuit 20 and the oscillation end of the current mirror circuit 20, and generates the clock signal according the oscillation voltage VOSC and the first voltage V1. The clock buffer 26, electrically connected to the output stage circuit 25, is configured to buffer the clock signal, and output a buffered clock signal.

In this embodiment, the output stage circuit 25 can be an inverter, and comprises a PMOS transistor MP1 and NMOS transistor MN1, a source of the PMOS transistor MP1 is electrically connected to the supply voltage VDD. A gate of the PMOS transistor MP1 is electrically connected to the oscillation voltage end of the current mirror circuit 20. A drain of the PMOS transistor MP1 is electrically connected to the first current end of the current mirror circuit 20, and a source of the NMOS transistor is electrically connected to the ground voltage GND. In the other words, the output buffer stage circuit 25 can act as a buffer circuit or an amplified circuit in other application, and the disclosure is not limited thereto.

When the second voltage V2 which is provided by the voltage matching circuit 24 matches the first voltage V1 of the temperature compensation circuit 22, the temperature compensation voltage VTHN decreases as the temperature increases. In the other words, the temperature compensation voltage VTHN is a voltage with the negative temperature coefficient. Since the temperature compensation voltage VTHN and the third reference current Iref3 decreases as the temperature increases, a delay time of the oscillation voltage VOSC is proportional to the temperature compensation voltage VTHN and inversely proportional to the third reference current Iref, the effects of temperature on the delay time just cancel each other out. A delay time on the oscillation voltage VOSC relates to a frequency of the clock signal. Therefore, if the delay time of the oscillation voltage VOSC is not affected by the temperature, the frequency of the clock signal will not be affected by temperature, thereby implementing the oscillator 2 with the low frequency drift.

Additionally, an electronic device is provided by an embodiment, according to the present disclosure, and the electronic device comprises the oscillator and a function circuit. The function circuit is electrically connected to the oscillator, and is manipulated by the oscillation voltage of the oscillator. A type of the function circuit is related to a type of the electronic device. For example, the electronic device can be a micro control device, and the function circuit can be a microcontroller; for another example, the electronic device can be a storage device, and the function circuit can be a flash memory module. Of course, the type of the electronic device and the function circuit mentioned above are not intended to limit the present disclosure.

Figure 3:
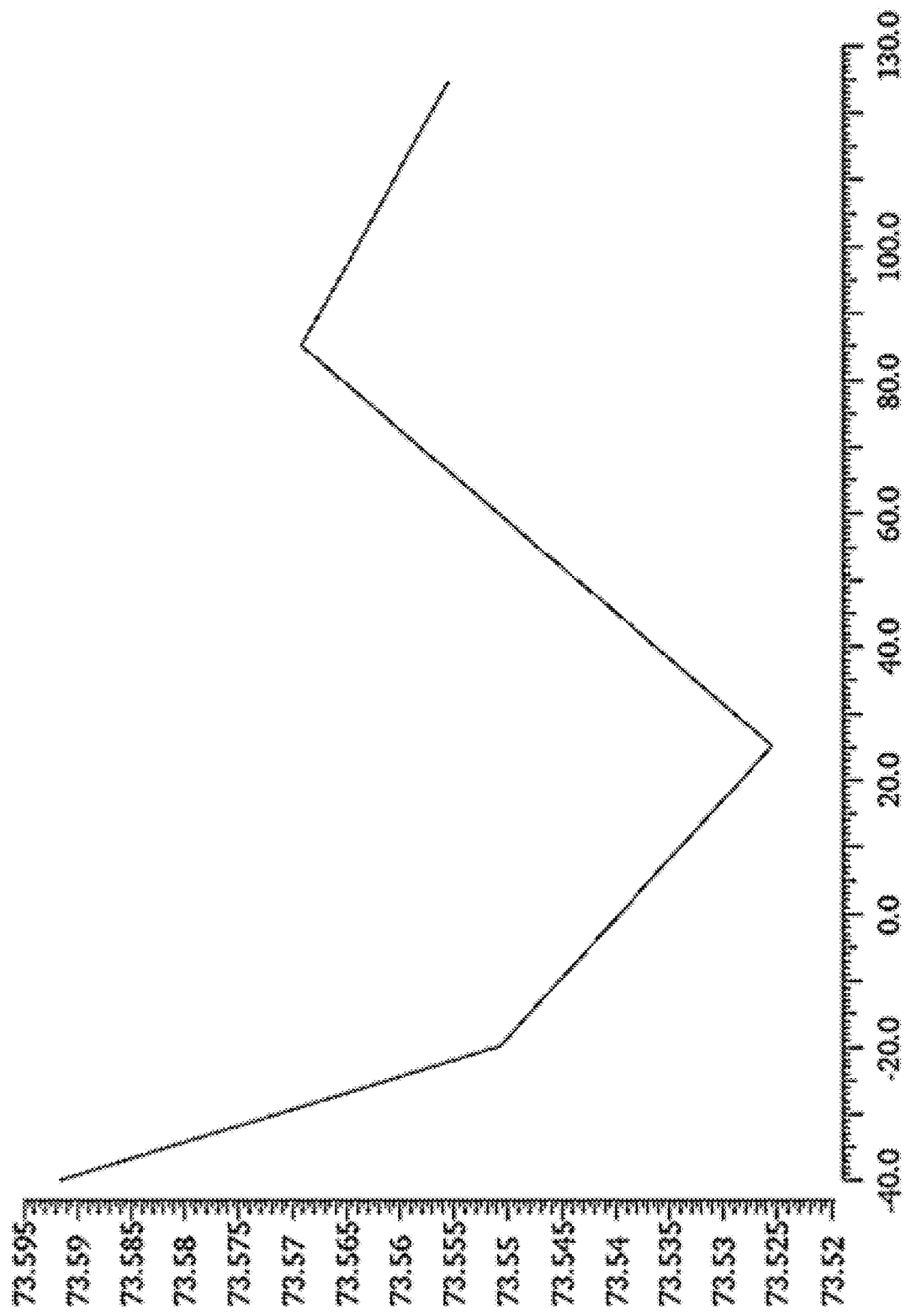
FIG. 3 is a curve diagram showing a relationship between a frequency of a clock signal of an oscillator and a temperature, according to the embodiment of the present disclosure.

Please refer to FIG. 3, which is a curve diagram of the relationship between the frequency of the clock signal of the oscillator and the temperature, according to the embodiment of the present disclosure. As shown in FIG. 3, while the temperature increases from −40 degrees Celsius to 130 degrees Celsius, the frequency of the clock signal varies between 73.525 KHz and 73.595 KHz, that is, the highest frequency drift is only 0.07 KHz, which is 70 Hz. Obviously, the oscillator, according to the embodiment of the present disclosure, meets the requirement of low frequency drift. Furthermore, as shown in FIG. 2, the temperature compensation circuit 22, according to the embodiment of the present disclosure, can be implemented by using only one NMOS transistor MN6. Therefore, the extra power consumption is extremely low, so the oscillator of the embodiment of the present disclosure can also meet the requirements of low power consumption. To sum up, the oscillator, according to the embodiment of the present disclosure meets the requirements of low frequency drift and low power consumption.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. An oscillator with temperature compensation, comprising:
   a current mirror circuit, having a bias end, a first reference current output end, a second reference current output end, a third reference current output end and an oscillation voltage output end, wherein the current mirror circuit respectively outputs a first reference current, a second reference current and a third reference current through the first reference current output end, the second reference current output end and the third reference current output end, and the current mirror circuit outputs an oscillation voltage through the oscillation voltage output end, wherein the first reference current, the second reference current and the third reference current decrease when a temperature increases;
   a bias circuit, electrically connected to the bias end, and configured to generate a reference voltage as a bias voltage of the current mirror circuit;
   a temperature compensation circuit, electrically connected to the first reference current output end, and configured to provide a first voltage to the current mirror circuit to make the current mirror circuit generate a temperature compensation voltage, wherein the temperature compensation voltage is configured to control whether the current mirror circuit outputs the third reference current to the third reference current output end, and the temperature compensation voltage decreases when temperature increases;
   a charge storage circuit, electrically connected to the second reference current output end, and configured to receive the second reference current for charging; and
   a voltage matching circuit, electrically connected to the third reference current output end, and configured to provide a second voltage to the current mirror circuit, wherein the second voltage is the same as the first voltage and the reference voltage.

2. The oscillator with temperature compensation according to claim 1, further comprising:
   an output stage circuit, electrically connected to the first reference current output end and the oscillation voltage output end, and configured to generate a clock signal based on the oscillation voltage and the first voltage.

3. The oscillator with temperature compensation according to claim 2, further comprising:
   a clock buffer, electrically connected to the output stage circuit, and configured to buffer the clock signal and output a buffered clock signal.

4. The oscillator with temperature compensation according to claim 3, wherein the output stage circuit is an inverter, and comprises a first PMOS transistor and a first NMOS transistor, a source of the first PMOS transistor is electrically connected to a supply voltage, a gate of the first PMOS transistor is electrically connected to the oscillation voltage output end, a drain of the PMOS transistor is electrically connected to a drain of the first NMOS transistor and the clock buffer, a gate of the first NMOS transistor is electrically connected to the first reference current output end, and a source of the NMOS transistor is electrically connected to a low voltage.

5. The oscillator with temperature compensation according to claim 4, wherein the current mirror circuit comprises a second PMOS transistor, a third PMOS transistor, a fourth PMOS transistor, a fifth PMOS transistor, a second NMOS transistor, a third NMOS transistor, a fourth NMOS transistor and a fifth NMOS transistor, a source of the second PMOS transistor, a source of the third PMOS transistor, a source of the fourth PMOS transistor and the source of the fifth PMOS transistor are electrically connected to the supply voltage, a gate of the second PMOS transistor is electrically connected to a drain of the second PMOS transistor, a gate of the third PMOS transistor, a gate of the fourth PMOS transistor and a gate of the fifth PMOS transistor, a drain of the second NMOS transistor, a drain of the third NMOS transistor, a drain of the fourth NMOS transistor and a drain of the fifth NMOS transistor are respectively electrically connected to the drain of the second PMOS transistor, a drain of the third PMOS transistor, a drain of the fourth PMOS transistor and a drain of the fifth PMOS transistor, a gate of the third NMOS transistor is electrically connected to a gate of the second NMOS transistor, a gate of the fourth NMOS transistor and the drain of the third NMOS transistor, a source of the second NMOS transistor acts as the bias end, a source of the third NMOS transistor acts as the first reference current output end, the drain of the fifth PMOS transistor acts as the oscillation voltage output end, the drain of the fourth NMOS transistor is electrically connected to a gate of the fifth NMOS transistor, a source of the fourth NMOS transistor as acts as the second reference current output end, a source of the fifth NMOS transistor acts as the third reference current output end, and the temperature compensation voltage is generated on the gate of the fifth NMOS transistor generates.

6. The oscillator with temperature compensation according to claim 5, wherein the bias circuit comprises a bias resistor, wherein one end of the bias resistor and another one end of the bias resistor are respectively electrically connected to the bias end and the low voltage.

7. The oscillator with temperature compensation according to claim 6, wherein the temperature compensation circuit comprises a sixth NMOS transistor, a drain of the sixth NMOS transistor is electrically connected to the first reference current output end and a gate of the sixth NMOS transistor, and a source of the sixth NMOS transistor is electrically connected to the low voltage, wherein the first voltage is a gate-source voltage of the sixth NMOS transistor.

8. The oscillator with temperature compensation according to claim 7, wherein the voltage matching circuit comprises a seventh NMOS transistor, a drain of the seventh NMOS transistor is electrically connected to the third reference current output end and a gate of the seventh NMOS transistor, and a source of the seventh NMOS transistor is electrically connected to the low voltage, wherein the second voltage is a gate-source voltage of the seventh NMOS transistor.

9. The oscillator with temperature compensation according to claim 8, wherein the charge storage circuit comprises an eighth NMOS transistor and a capacitor, one end of the capacitor and another one end of the capacitor are respectively electrically connected to the second reference current output end and the low voltage, a gate of the eighth transistor is electrically connected to a discharge reset signal, a drain of the eighth NMOS transistor is electrically connected to the second reference current output end, and a source of the eighth NMOS transistor is electrically connected to the low voltage.

10. An electronic device, comprising:
a current mirror circuit, having a bias end, a first reference current output end, a second reference current output end, a third reference current output end and an oscillation voltage output end, wherein the current mirror circuit respectively outputs a first reference current, a second reference current and a third reference current through the first reference current output end, the second reference current output end and the third reference current output end, and the current mirror circuit outputs an oscillation voltage through the oscillation voltage output end, wherein the first reference current, the second reference current and the third output current decrease when a temperature increases;
a bias circuit, electrically connected to the bias end, configured to generate a reference voltage as a bias voltage of the current mirror circuit;
a temperature compensation circuit, electrically connected to the first reference current output end, configured to provide a first voltage to the current mirror circuit to make the current mirror circuit generate a temperature compensation voltage, wherein the temperature compensation voltage is configured to control whether the current mirror circuit outputs the third reference current to the third reference current output end, and the temperature compensation voltage decreases as when temperature increases;
a charge storage circuit, electrically connected to the second reference current output end, configured to receive the second reference current for charging;
a voltage matching circuit, electrically connected to the third reference current output end, configured to provide a second voltage to the current mirror circuit, wherein the second voltage is the same as the first voltage and the reference voltage; and
a function circuit, electrically connected to the oscillator with temperature compensation, configured to manipulate according to the oscillation voltage.

11. The electrical device according to claim 10, comprising:
an output stage circuit, electrically connected to the first reference current output end and the oscillation voltage output end, configured to generate a clock signal according to the oscillation voltage and the first voltage.

12. The electrical device according to claim 11, comprising:
a clock buffer, electrically connected to the output stage circuit, configured to buffer the clock signal and output a buffered clock signal.

13. The electrical device according to claim 12, wherein the output stage circuit is an inverter, and comprises a first PMOS transistor and a first NMOS transistor, a source of the first PMOS transistor is electrically connected to a supply voltage, a gate of the first PMOS transistor is electrically connected to the oscillation voltage output end, a drain of the PMOS transistor is electrically connected to a drain of the first NMOS transistor and the clock buffer, a gate of the first NMOS transistor is electrically connected to the first reference current output end, and a source of the NMOS transistor is electrically connected to a low voltage.

14. The electrical device according to claim 13, wherein the current mirror circuit comprises a second PMOS transistor, a third PMOS transistor, a fourth PMOS transistor, a fifth PMOS transistor, a second NMOS transistor, a third NMOS transistor, a fourth NMOS transistor and a fifth NMOS transistor, a source of the second PMOS transistor, a source of the third PMOS transistor, a source of the fourth PMOS transistor and the source of the fifth PMOS transistor are electrically connected to the supply voltage, a gate of the second PMOS transistor is electrically connected to a drain of the second PMOS transistor, a gate of the third PMOS transistor, a gate of the fourth PMOS transistor and a gate of the fifth PMOS transistor, a drain of the second NMOS transistor, a drain of the third NMOS transistor, a drain of the fourth NMOS transistor and a drain of the fifth NMOS transistor are respectively electrically connected to the drain of the second PMOS transistor, a drain of the third PMOS transistor, a drain of the fourth PMOS transistor and a drain of the fifth PMOS transistor, a gate of the third NMOS transistor is electrically connected to a gate of the second NMOS transistor, a gate of the fourth NMOS transistor and the drain of the third NMOS transistor, a source of the second NMOS transistor acts as the bias end, a source of the third NMOS transistor acts as the first reference current output end, the drain of the fifth PMOS transistor acts as the oscillation voltage output end, the drain of the fourth NMOS transistor is electrically connected to a gate of the fifth NMOS transistor, a source of the fourth NMOS transistor as acts as the second reference current output end, a source of the fifth NMOS transistor acts as the third reference current output end, and the temperature compensation voltage is generated on the gate of the fifth NMOS transistor generates.

15. The electrical device according to claim 14, wherein the bias circuit comprises a bias resistor, wherein one end of the bias resistor and another one of the bias resistor are respectively electrically connected to the bias end and the low voltage.

16. The electrical device according to claim 15, wherein the temperature compensation circuit comprises a sixth NMOS transistor, a drain of the sixth NMOS transistor is electrically connected to the first reference current output end and a gate of the sixth NMOS transistor, and a source of the sixth NMOS transistor is electrically connected to the low voltage, wherein the first voltage is as a gate-source voltage of the sixth NMOS transistor.

17. The electrical device according to claim 16, wherein the voltage matching circuit comprises a seventh NMOS transistor, a drain of the seventh NMOS transistor is electrically connected to the third reference current output end and a gate of the seventh NMOS transistor, and a source of the seventh NMOS transistor is electrically connected to the low voltage, wherein the second voltage is a gate-source voltage of the seventh NMOS transistor.

18. The electrical device according to claim 17, wherein the charge storage circuit comprises an eighth NMOS transistor and a capacitor, one end of the capacitor and another one end of the capacitor are respectively electrically connected to the second reference current output end and the low voltage, a gate of the eighth transistor is electrically connected to a discharge reset signal, a drain of the eighth NMOS transistor is electrically connected to the second reference current output end, and a source of the eighth NMOS transistor is electrically connected to the low voltage.

\* \* \* \* \*